(12) United States Patent
Banna

(10) Patent No.: US 8,264,017 B2
(45) Date of Patent: Sep. 11, 2012

(54) JUNCTION FIELD EFFECT TRANSISTOR HAVING A DOUBLE GATE STRUCTURE

(75) Inventor: Srinivasa R. Banna, San Jose, CA (US)

(73) Assignee: SuVolta, Inc., Los Gatos, CA (US)

( * ) Notice: Subject to any disclaimer, the term of this patent is extended or adjusted under 35 U.S.C. 154(b) by 0 days.

(21) Appl. No.: 13/218,600

(22) Filed: Aug. 26, 2011

(65) Prior Publication Data

US 2011/0303955 A1 Dec. 15, 2011

Related U.S. Application Data

(63) Continuation of application No. 12/326,415, filed on Dec. 2, 2008, now Pat. No. 8,017,476.

(51) Int. Cl.
*H01L 29/80* (2006.01)
*H01L 31/112* (2006.01)
(52) U.S. Cl. .......... 257/263; 257/270; 438/256
(58) Field of Classification Search .......... 257/173, 257/270, E29.312; 438/256
See application file for complete search history.

(56) References Cited

U.S. PATENT DOCUMENTS

| | | | |
|---|---|---|---|
| 5,424,572 A | 6/1995 | Solheim | |
| 6,268,953 B1 * | 7/2001 | Maloney | 359/321 |
| 6,657,241 B1 * | 12/2003 | Rouse et al. | 257/173 |
| 2001/0022359 A1 * | 9/2001 | Mehta | 257/1 |
| 2002/0182810 A1 | 12/2002 | Oh | |
| 2003/0107069 A1 | 6/2003 | Takao | |
| 2007/0069306 A1 | 3/2007 | Kapoor et al. | |
| 2008/0308816 A1 | 12/2008 | Miller et al. | |

OTHER PUBLICATIONS

PCT Notification of Transmittal of the International Search Report and the Written Opinion of the International Searching Authority, or the Declaration, PCT/US2009/065889, 8 pages, dated Jul. 8, 2010.

* cited by examiner

*Primary Examiner* — Phuc Dang
(74) *Attorney, Agent, or Firm* — Baker Botts L.L.P.

(57) ABSTRACT

A junction field effect transistor includes a channel region, a gate region coupled to the channel region, a well tap region coupled to the gate region and the channel region, and a well region coupled to the well tap region and the channel region. A double gate operation is achieved by this structure as a voltage applied to the gate region is also applied to the well region through the well tap region in order to open the channel from both the gate region and the well region.

19 Claims, 6 Drawing Sheets

JUNCTION FIELD EFFECT TRANSISTOR HAVING A DOUBLE GATE STRUCTURE

CROSS-REFERENCE TO RELATED APPLICATION

This application is a continuation of U.S. application Ser. No. 12/326,415 filed Dec. 2, 2008, U.S. Pat. No. 8,017,476, and entitled "A Junction Field Effect Transistor Having a Double Gate Structure and Method of Making Same".

TECHNICAL FIELD OF THE INVENTION

The present invention relates in general to semiconductor devices and fabrication and more particular to a junction field effect transistor having a double gate structure and method of making same.

BACKGROUND OF THE INVENTION

In conventional junction field effect transistors, a top gate controls about half of the depletion width and opening of the channel in transitioning between on and off operation. The substrate controls the other half of the depletion width and opening of the channel. During off operation, the channel is closed and an off state current is established. During on operation, the top gate causes its half of the channel to recede and open for electron flow. For a single gate operation, the other half of the channel remains constant. As a result, on state current for the transistor has a proportional relationship with channel opening. However, it is desirable to increase the on state current while maintaining the off state current. To accomplish this, a double gate structure is utilized where the substrate acts as the second gate. Voltage can be applied to the gate substrate to cause its half of the channel to recede and open and thus create a greater opening in conjunction with the opening caused by the on state operation of the top gate. This increases the on state current of the transistor and the speed of the device. However, conventional double gate structures use an increased area for the transistor which negates the benefit of increased on state current.

SUMMARY OF THE INVENTION

From the foregoing, it may be appreciated by those skilled in the art that a need has arisen for a junction field effect transistor with a double gate structure that increases on state current without unnecessarily enlarging the area for the junction field effect transistor that would significantly offset the benefits achieved by increased on state current. In accordance with the present invention there is provided a junction field effect transistor having a double gate structure and method of making same that substantially eliminate or greatly reduce problems and limitations associated with conventional double gate transistor fabrication processes.

In accordance with an embodiment of the present invention, a junction field effect transistor is provided that includes a channel region, a gate region coupled to the channel region, a well tap region coupled to the gate region and the channel region, and a well region coupled to the well tap region and the channel region. A double gate operation is achieved by this structure as a voltage applied to the gate region is also applied to the well region through the well tap region in order to open the channel from both the gate region and the well region.

The present invention provides various technical advantages over conventional double gate transistor devices. For example, one technical advantage is reducing the area of the transistor while providing a double gate structure. Another technical advantage is to use a well tap under the active region, eliminating having a well tap outside of the source and/or drain regions that increase the area of the transistor as in conventional designs. Yet another technical advantage is to reduce the size of the well region to prevent cross talk between two adjacent transistors. Some of these technical advantages are shown and described in the description of the present invention. Embodiments of the present invention may enjoy some, all, or none of these advantages. Other technical advantages may be readily apparent to one skilled in the art from the following figures, description, and claims.

BRIEF DESCRIPTION OF THE INVENTION

For a more complete understanding of the present invention including advantages thereof, reference is made to the following description taken in conjunction with the accompanying drawings, wherein like reference numerals represent like part, in which.

DETAILED DESCRIPTION OF THE INVENTION

Figure 1:
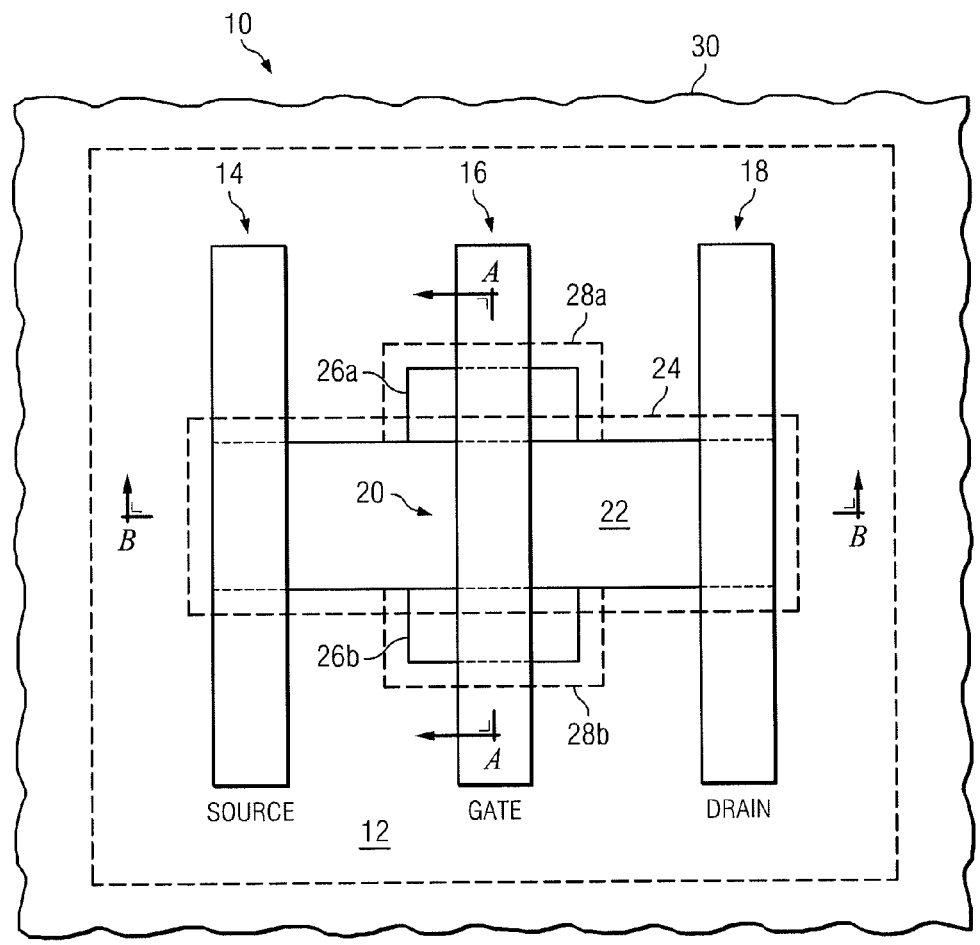
FIG. 1 illustrates an example top view of a double gate structure for a junction field effect transistor.

FIG. 1 is a top view of a junction field effect transistor 10 having a double gate structure in accordance with a particular embodiment of the invention. Junction field effect transistor 10 includes a substrate 12, a source region 14, a gate region 16, a drain region 18, an active area 20, and a shallow trench isolation (STI) region 30. As represented in FIG. 1, active area 20 includes a n-type channel body 22 and endcap regions 26a and 26b. Junction field effect transistor 10 further includes a n-type channel implant region 24 that surrounds n-type channel body 22 of active region 20. The illustrated embodiment also includes p+ type well tap implant regions 28a and 28b that surround endcap regions 26a and 26b.

Figure 2:
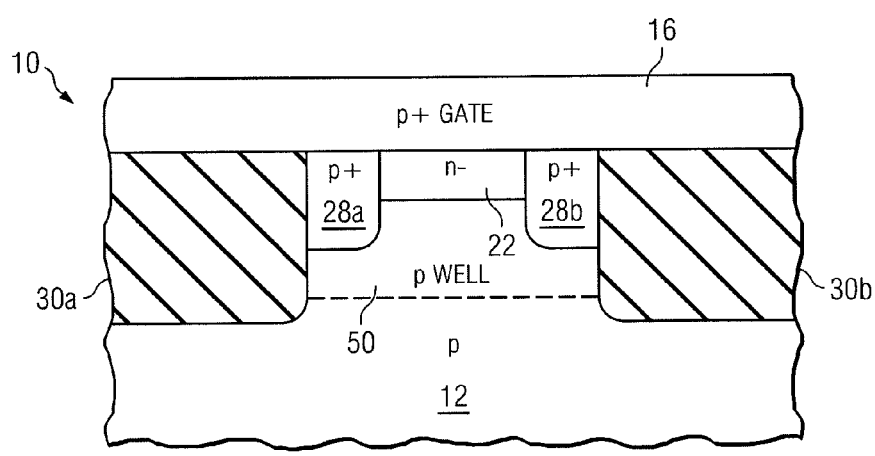
FIG. 2 illustrates an example cross sectional view of the double gate junction field effect transistor.

FIG. 2 is a cross sectional view of a portion of junction field effect transistor 10 viewed along plane A-A of FIG. 1 and showing other features of junction field effect transistor 10. As illustrated, junction field effect transistor 10 includes gate region 16, STI regions 30a and 30b, and substrate 12. Gate region 16 may be a p+ type semiconductor and may be positioned above STI regions 30a and 30b and substrate 12. In the illustrated view, substrate 12 is a p type semiconductor and includes P type well region 50. Also shown formed in substrate 12 are p+ type well tap implant regions 28a and 28b and n-type channel body 22. The p+ type well tap implant regions 28a and 28b may be positioned between n-type channel body 22 and STI regions 30a and 30b. The p type well 50 may be positioned below p+ type well tap implant regions 28a and 28b and n-type channel body 22 and may generally have a depth no greater than STI regions 30a and 30b. Conventional transistors with a double gate structure require the p type well region 50 to extend below and at least partially around STI regions 30a and 30b in order to provide second gate operation with an isolated well tap. By limiting the depth of p type well region 50 so that it is bounded by STI regions 30a and 30b, interaction between p type well regions 50 of adjacent junction field effect transistors formed in substrate 12 is eliminated by the isolation provided by STI regions 30a and 30b. in addition, a size of STI regions 30a and 30b can be reduced as the spacing between p type well regions, normally critical for proper operation of conventional junction field effect transistors, is no longer a factor with the junction field effect transistor of the present invention.

FIGS. 3A-3F and FIGS. 4A-4F are cross sectional views illustrating a particular embodiment of a process for fabricating junction field effect transistor 10 of FIGS. 1 and 2. Specifically, FIGS. 3A-3F illustrate the described fabrication process along plane A-A of FIG. 1, while FIGS. 4A-4F represent cross sectional views along plane B-B of FIG. 1.

Figure 3A:
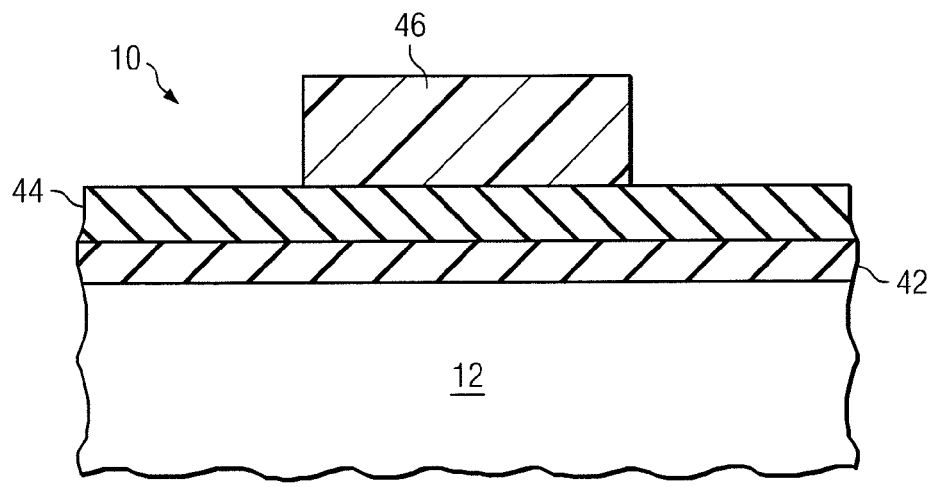
FIGS. 3A-3F illustrate an example process for fabricating the double gate junction field effect transistor from a first cross sectional perspective.

With reference to FIG. 3A, a portion of junction field effect transistor 10 is illustrated after initial fabrication steps. In the illustrated embodiment, junction field effect transistor 10 includes substrate 12 after the formation of a pad oxide layer 42 and a nitride layer 44 and after the application of a photoresist material 46. Substrate 12 may be any suitable material used in semiconductor chip fabrication including silicon, Silicon on Insulator, poly-silicon, indium phosphide, germanium, and gallium arsenide. Pad oxide layer 42 may comprise, for example, oxide, silicon dioxide, or oxi-nitride or any other oxide material suitable for semiconductor fabrication. Nitride layer 44 may comprise silicon-nitride or any other nitride material suitable for semi-conductor fabrication. In one non-limiting example, pad oxide layer 42 and/or nitride layer 44 may be formed via a deposition process. Suitable deposition technologies may include physical vapor deposition (PVD), chemical vapor deposition (CVD), electrochemical deposition (ECD), molecular beam epitaxy (MBE), and atomic layer deposition as well as any other conventional techniques. Photoresist material 46 may be any suitable positive or negative photoresist material used in standard photolithography applications. In an embodiment, photoresist material 46 may be applied over a portion of nitride layer 44 that corresponds to active area 20 of junction field effect transistor 10. After application, photoresist material 46 may be exposed.

Figure 3B:
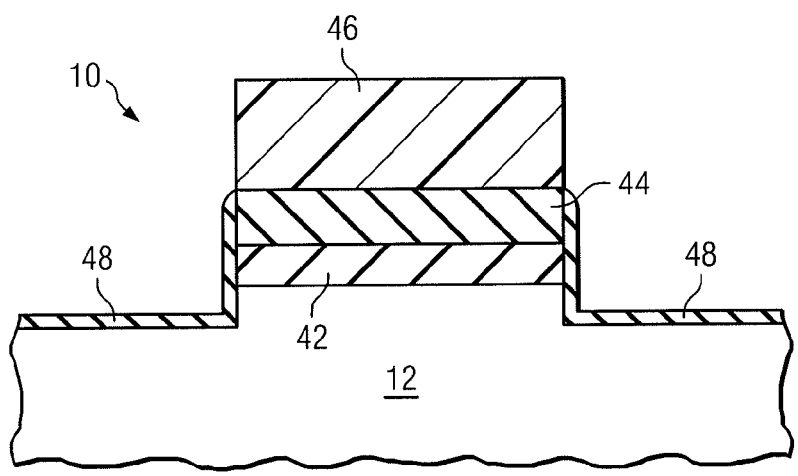

FIG. 3B represents junction field effect transistor 10 of FIG. 3A after partially undergoing an etching process. As illustrated, nitride layer 44, pad oxide layer 42, and substrate 12 may be etched along the one side of photoresist material 46. Etching of nitride layer 44, pad oxide layer 42, and substrate 12 may be performed by any of various etching techniques. While the illustrated embodiment depicts junction field effect transistor 10 after performing an etching procedure to a single side thereof, the described etching process may also be performed along a corresponding opposite edge of photoresist material 46. After etching, a rounding oxide layer 48 may be applied along the etched edges of nitride layer 44, pad oxide layer 42, and substrate 12. Rounding oxide layer 48 may be a thermal oxide or gate oxide of a very thin depth that passivates the etched surface thereby smoothing surface irregularities caused by the etching process. Once the rounding oxide layer 48 is applied, photoresist material 46 may be stripped away.

Figure 3C:
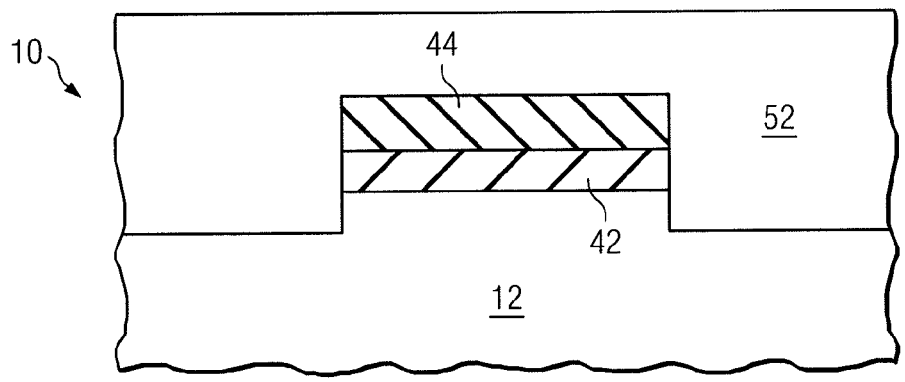

FIG. 3C shows junction field effect transistor 10 after the removal of photoresist material 46 and after depositing and polishing a trench oxide layer 52. Trench oxide layer 52 may be substantially similar to pad oxide layer 42 and may also be formed in a similar manner. As illustrated in FIG. 3C, trench oxide layer 52 is only partially polished and thus may be further reduced by additional polishing as desired. The polishing of trench oxide layer 52 may be performed using any conventional polishing technique. In certain embodiments, the polishing process may use nitride layer 44 as an etch stop and, in some cases, even remove a portion of nitride layer 44. Accordingly, trench oxide layer 52 may be polished down to nitride layer 44, thereby leaving portions of trench oxide layer 52 on either lateral side of nitride layer 44 and pad oxide layer 42. The remaining portions of trench oxide layer 52 form STI regions 30a and 30b shown in FIG. 2.

Figure 3D:
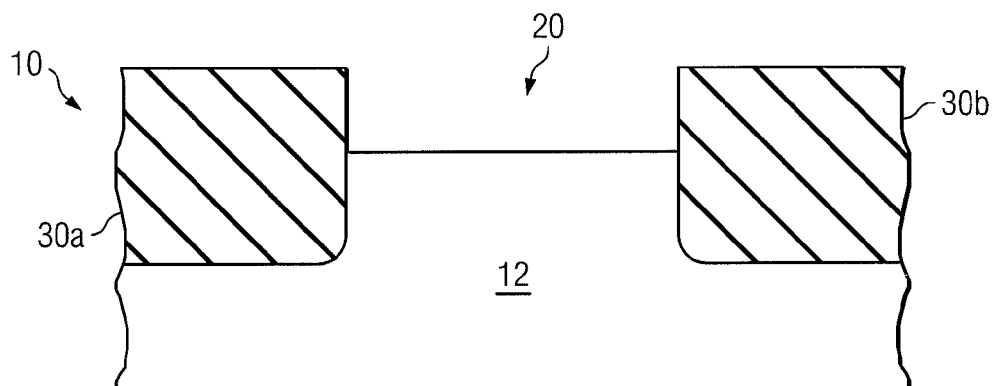

FIG. 3D is a cross sectional view of junction field effect transistor 10 after the removal of nitride layer 44 and pad oxide layer 42. Upon removing nitride layer 44 and pad oxide layer 42, junction field effect transistor 10 includes STI regions 30a and 30b, active area 20, and substrate 12. Nitride layer 44 and pad oxide layer 42 may be removed using any conventional etching process. Because STI regions 30a and 30b are formed from an oxide, removing pad oxide layer 42 may also etch portions of STI regions 30a and 30b. To limit the etching that occurs to STI regions 30a and 30b, trench oxide layer 52 (shown in FIG. 3C) may undergo a densification process during formation. This process may harden trench oxide layer 52, thereby lowering its etch rate. Decreasing the etch rate of trench oxide layer 52 may limit the etching that occurs to STI regions 30a and 30b during the removal of pad oxide layer 42.

Figure 3E:
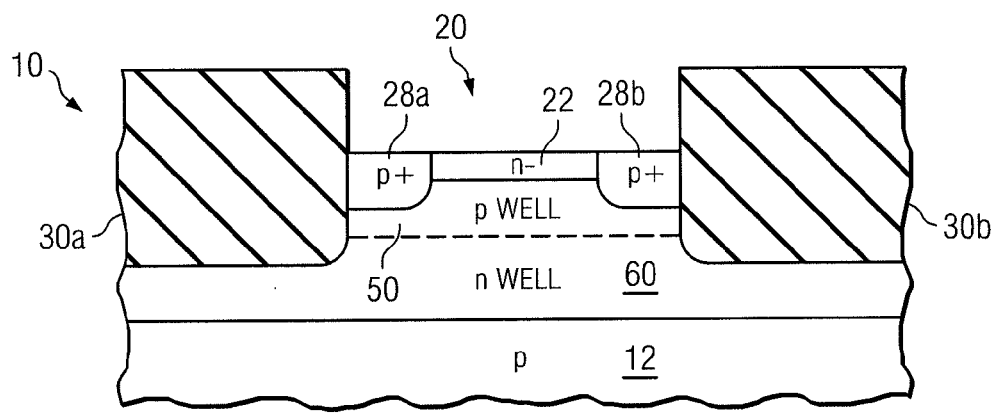

FIG. 3E shows junction field effect transistor 10 of FIG. 3D after doping substrate 12 to form n-type channel body from n-type channel implant region 24, p+ type well tap implant regions 28a and 28b, p type well region 50, and an optional n type well region 60. The described doping processes may be performed in any suitable order. Suitable doping processes may include, for example, implantation and/or diffusion or any other conventional doping techniques. Prior to doping, a thin oxide layer (not shown) may be grown on the surface of active area 20. The thin oxide layer may be of a thickness between 20 and 150 angstroms and serve as a screen to protect the surface of active area 26 during doping. As illustrated, a depth of p+ type well tap region implant regions 28a and 28b and p type well region 50 may be less than the depth of STI regions 30a and 30b. The n type well region 60 may be positioned between p type well region 50 and substrate 12. The n type well region 60 may function to prevent p type well region 50 of junction field effect transistor 10 from interacting with one or more other p type well regions associated with adjacent junction field effect transistors 10 which may be formed on the same substrate 12. By limiting the depth of p type well region 50 as described above and isolating the active area 20 of junction field effect transistor 10 within STI regions 30a and 30b, n type well region 60 may not be necessary or may be used to provide further protection against well region interactions.

Figure 3F:
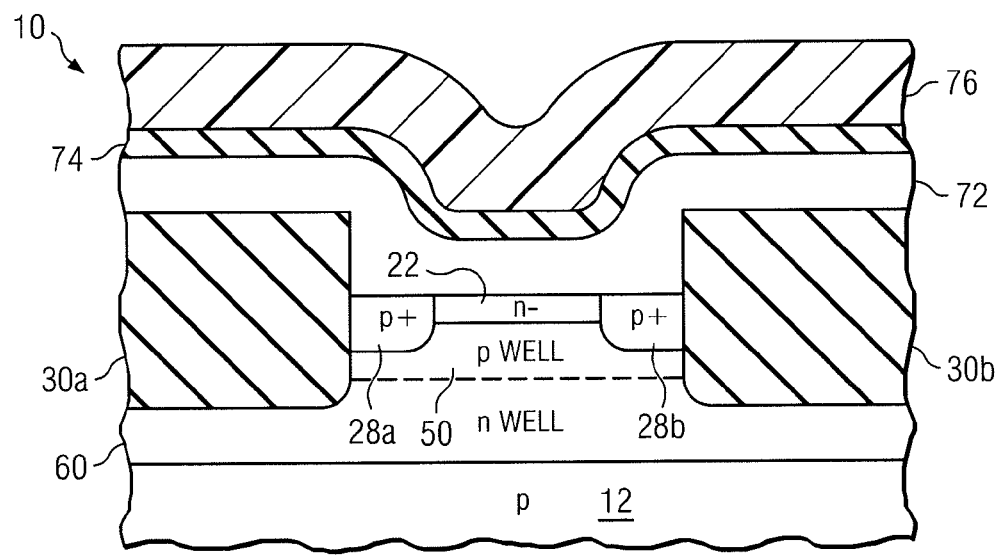

FIG. 3F shows junction field effect transistor 10 of FIG. 3E after applying a polysilicon layer 72, a second nitride layer 74, and a second photoresist material 76. Polysilicon layer 72 may have a thickness of approximately 500 angstroms. Second nitride layer 74 may be substantially similar to nitride layer 44 described with respect to FIG. 3A. Second nitride layer 74 may have a thickness of approximately 300 angstroms. After applying second photoresist material 76 over the surface of second nitride layer 74, junction field effect transistor 10 may be etched along boundaries that are substantially parallel to plane A-A and substantially perpendicular to plane B-B of FIG. 1 in order to form gate region 16, source region 14, and drain region 18.

Figure 4A:
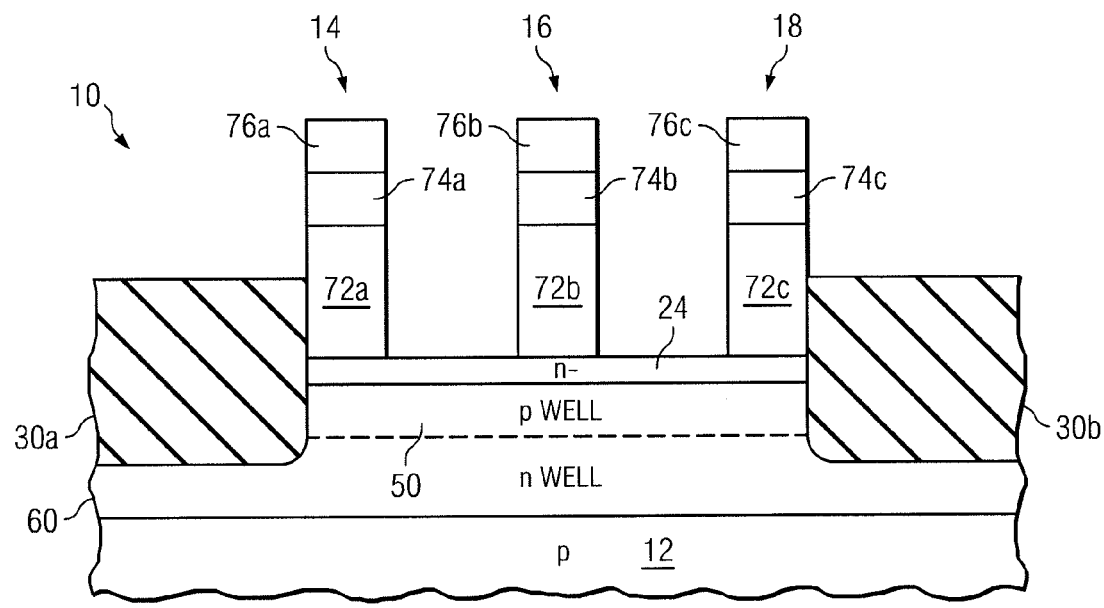
FIGS. 4A-4F illustrate an example process for fabricating the double gate junction field effect transistor from a second cross sectional perspective.

Continuing with the process in reference to FIGS. 4A-4F, cross-sectional views of junction field effect transistor 10 along plane A-A of FIG. 1 are provided. FIG. 4A represents a cross-sectional view of junction field effect transistor 10 of FIG. 3F after undergoing an etching procedure. As illustrated, second photoresist material 76, second nitride layer 74, and polysilicon layer 72 have been etched to expose portions of active area 20. The unetched portions of junction field effect transistor 10 may correspond to source region 14, gate region 16, and drain region 18.

Figure 4B:
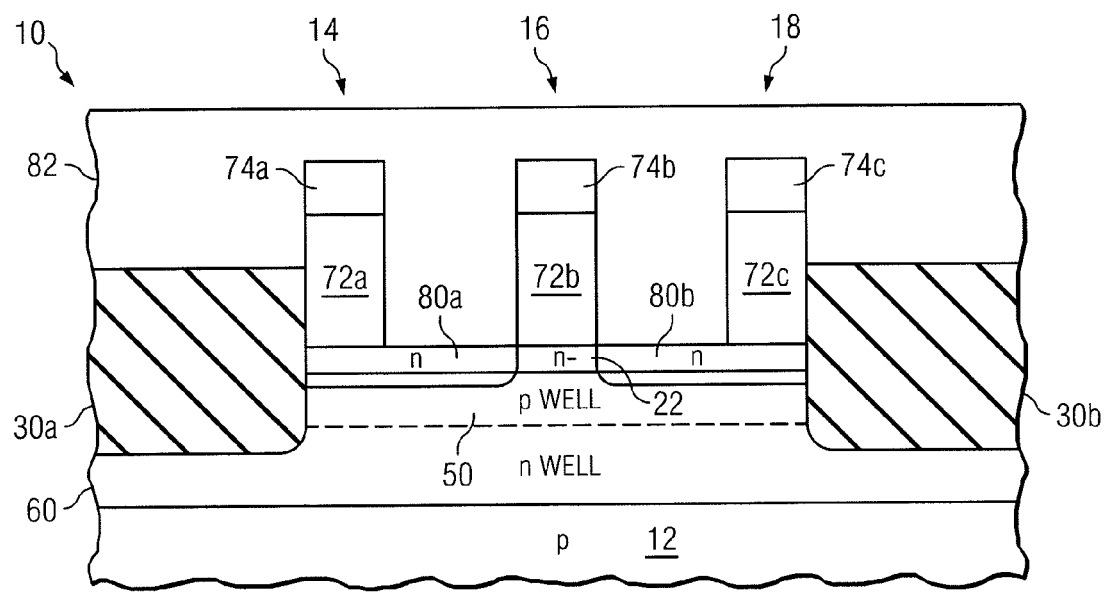

FIG. 4B shows junction field effect transistor 10 of FIG. 4A after removing second photoresist material 76, forming of link regions 80a and 80b, n-type channel body 22, and applying an oxide layer 82. Link regions 80a and 80b may be of a similar dopant material as n-type channel implant region 24. In an embodiment, link regions 80a and 80b may be of 3-5 angstroms and have a higher dopant concentration than n-type channel implant region 24. After doping of link regions 80a and 80b to establish n-type channel body 22, oxide layer 82 may be applied over the upper surface of junction field effect transistor 10. Oxide layer 82 may be substantially similar to oxide layer 52 described with respect to FIG. 3C and may be applied in a similar manner. Once deposited, oxide layer 82 may undergo a densification process which is followed by a polishing procedure substantially similar to the procedure described with respect to oxide layer 52.

Figure 4C:
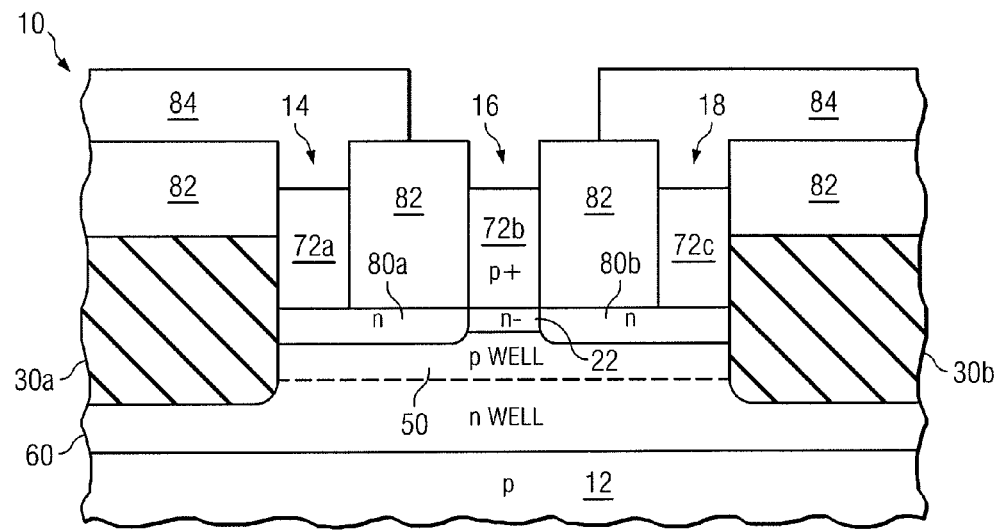

FIG. 4C shows junction field effect transistor 10 of FIG. 4B after polishing oxide layer 82 and removing portions of second nitride layer 74. Second nitride layer 74 may be removed in a similar manner as nitride layer 44. After removing second nitride layer 74, a photoresist mask 84 may be positioned over portions of the surface of junction field effect transistor 10, leaving polysilicon section 72b associated with gate region 16 exposed. After applying photoresist mask 84, polysilicon section 72b corresponding to gate 16 may be doped with a p+ type dopant using any suitable doping procedure.

Figure 4D:
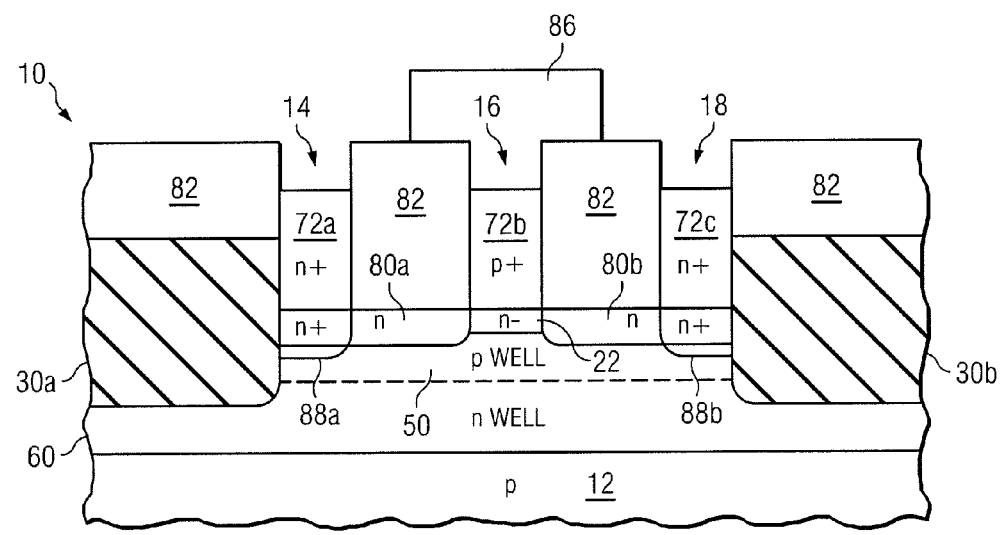

FIG. 4D illustrates junction field effect transistor 10 of FIG. 4C after removing photoresist mask 84 and applying another photoresist mask 86. Photoresist mask 86 may be substantially similar to photoresist mask 84 and may be deposited over polysilicon section 72b, leaving polysilicon sections 72a and 72c associated with source region 14 and drain region 18 exposed. Once photoresist mask 86 is applied, polysilicon sections 72a and 72c may be doped with a n+type dopant using any suitable doping procedure. The doping procedure may form n+type link well regions 88a and 88b below polysilicon sections 72a and 72.

Figure 4E:
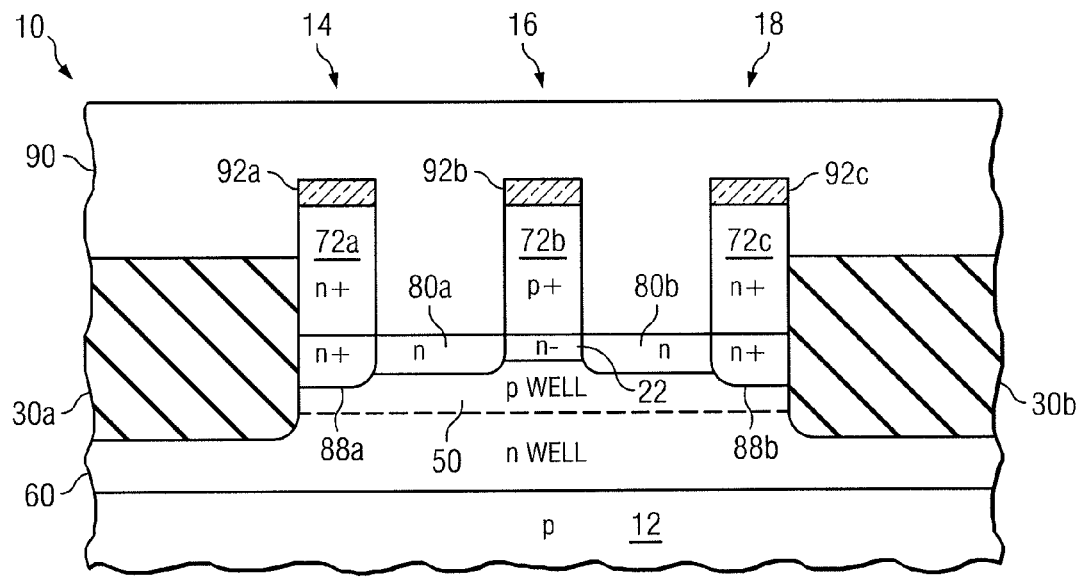

FIG. 4E shows junction field effect transistor 10 of FIG. 4D after removing photoresist mask 86 and applying cobalt layer 90 to the surface. In general, cobalt reacts with silicon but not oxide. Accordingly, cobalt layer 90 may react with the exposed portions of polysilicon sections 72a, 72b, and 72c to form silicide layers 92a, 92b, and 92c, respectively. The unreacted portions of cobalt layer 90 may be removed during a cleaning process. Prior to formation of silicide layers 92a, 92b, and 92c, an anneal process is applied to junction field effect transistor 10 in order to activate the dopants therein.

Figure 4F:
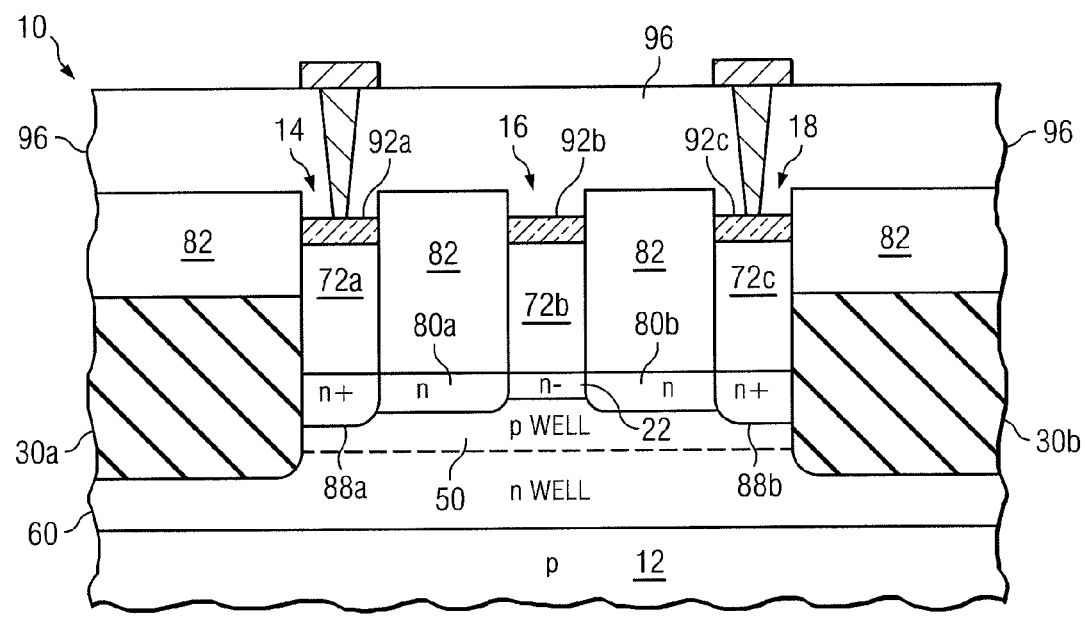

FIG. 4F shows junction field effect transistor 10 of FIG. 4E after removing the unreacted portions of cobalt layer 90 and after forming source contact pad 94a and drain contact pad 94c. Source contact pad 94a and drain contact pad 94c may be formed by drilling holes through an oxide layer 96 which is deposited over the surface of junction field effect transistor 10. Oxide layer 96 may be substantially similar to the previously described oxide layers and may be deposited using any of the described processes. Tungsten may be used to fill the holes formed in oxide layer 96 and provide the metal connection for source contact pad 94a and drain contact pad 94b. A gate contact pad may be similarly formed and can be positioned over STI region 30a of FIG. 3F.

By having p+ well tap implant regions 28a and 28b in contact with gate region 16, both top and bottom gate-channel operation is achieved in order to increase the on state current for junction field effect transistor 10. Though shown having two p+ well tap implant regions 28a and 28b, junction field effect transistor 10 may be formed with only a single p+ well tap region while still providing the benefit of increased on state current.

Although the present invention has been described in detail with reference to a particular embodiment, it should be understood that various other changes, substitutions, and alterations may be made hereto without departing from the spirit and scope of the present invention. For example, although the present invention has been described with reference to a specific dopant type for each region within the junction field effect transistor, the dopant type may be changed in order to have a junction field effect transistor with different operating characteristics.

Numerous other changes, substitutions, variations, alterations, and modifications may be ascertained by those skilled in the art and it is intended that the present invention encompass all such changes, substitutions, variations, alterations, and modifications as falling within the spirit and scope of the appended claims. Moreover, the present invention is not intended to be limited in any way by any statement in the specification that is not otherwise reflected in the appended claims.

What is claimed is:

1. A junction field effect transistor, comprising:
a channel region;
a gate region coupled to the channel region;
a well tap region coupled to the gate region and the channel region; and
a well region coupled to the well tap region and the channel region;
wherein the gate region is in contact with a top side of the channel region, the well region is in contact with a bottom side of the channel region, and the well tap region is in contact with a first lateral side of the channel region.

2. The junction field effect transistor of claim 1, further comprising:
a shallow trench isolation region surrounding the channel region, the well tap region, and the well region.

3. The junction field effect transistor of claim 2, wherein the well tap region has less depth than the shallow trench isolation region.

4. The junction field effect transistor of claim 2, wherein the well region has less depth than the shallow trench isolation region.

5. The junction field effect transistor of claim 1, wherein the gate region has a p+ type dopant profile, the well tap region has a p+ type dopant profile, the well region has a p type dopant profile, and the channel region has a n– type dopant profile.

6. The junction field effect transistor of claim 1, wherein the gate region has a n+ type dopant profile, the well tap region has a n+ type dopant profile, the well region has a n type dopant profile, and the channel region has a p– type dopant profile.

7. The junction field effect transistor of claim 1, wherein the well tap region includes first and second well tap region portions on opposite sides of the channel region.

8. The junction field effect transistor of claim 1, further comprising:

a contact pad coupled to the gate region, wherein the channel region is operable to fully open towards both the gate region and the well region in response to a voltage applied to the contact pad.

9. The junction field effect transistor of claim 8, wherein an electrical contact is formed between the gate region and the top side of the channel region and an electrical contact is formed from the gate region to the well tap region to the well region to the bottom side of the channel region.

10. A junction field effect transistor, comprising:
a channel region;
a gate region coupled to the channel region;
a well tap region coupled to the gate region and the channel region, wherein the well tap region includes first and second well tap region portions on opposite sides of the channel region; and
a well region coupled to the well tap region and the channel region.

11. The junction field effect transistor of claim 10, further comprising:
a shallow trench isolation region surrounding the channel region, the well tap region, and the well region.

12. The junction field effect transistor of claim 10, wherein the gate region is in contact with a top side of the channel region, the well region is in contact with a bottom side of the channel region, and the well tap region is in contact with a first lateral side of the channel region.

13. The junction field effect transistor of claim 10, further comprising:
a contact pad coupled to the gate region, wherein the channel region is operable to fully open towards both the gate region and the well region in response to a voltage applied to the contact pad.

14. The junction field effect transistor of claim 13, wherein an electrical contact is formed between the gate region and the top side of the channel region and an electrical contact is formed from the gate region to the well tap region to the well region to the bottom side of the channel region.

15. A junction field effect transistor, comprising:
a channel region;
a gate region coupled to the channel region;
a well tap region coupled to the gate region and the channel region;
a well region coupled to the well tap region and the channel region; and
a contact pad coupled to the gate region, wherein the channel region is operable to fully open towards both the gate region and the well region in response to a voltage applied to the contact pad.

16. The junction field effect transistor of claim 15, wherein an electrical contact is formed between the gate region and the top side of the channel region and an electrical contact is formed from the gate region to the well tap region to the well region to the bottom side of the channel region.

17. The junction field effect transistor of claim 15, wherein the gate region is in contact with a top side of the channel region, the well region is in contact with a bottom side of the channel region, and the well tap region is in contact with a first lateral side of the channel region.

18. The junction field effect transistor of claim 15, wherein the well tap region includes first and second well tap region portions on opposite sides of the channel region.

19. The junction field effect transistor of claim 15, further comprising:
a shallow trench isolation region surrounding the channel region, the well tap region, and the well region.

* * * * *